(12) United States Patent
Chen et al.

(10) Patent No.: US 12,119,427 B2
(45) Date of Patent: Oct. 15, 2024

(54) LIGHT EMITTING DEVICE

(71) Applicant: Lextar Electronics Corporation, Hsinchu (TW)

(72) Inventors: Jih-Kang Chen, Hsinchu (TW); Shih-Wei Yang, Hsinchu (TW); Tsai-Chen Sung, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 18/336,040

(22) Filed: Jun. 16, 2023

(65) Prior Publication Data

US 2023/0335680 A1    Oct. 19, 2023

Related U.S. Application Data

(62) Division of application No. 17/246,693, filed on May 2, 2021.

(30) Foreign Application Priority Data

Jul. 8, 2020    (CN) .......................... 202010650792.2

(51) Int. Cl.
*H01L 33/38* (2010.01)
*H01L 27/15* (2006.01)
(Continued)

(52) U.S. Cl.
CPC .......... *H01L 33/382* (2013.01); *H01L 27/156* (2013.01); *H01L 33/22* (2013.01);
(Continued)

(58) Field of Classification Search
None
See application file for complete search history.

(56) References Cited

U.S. PATENT DOCUMENTS 8,368,089 B2 *   2/2013   Kojima ................... H01L 33/50
                                                         257/E33.013
8,450,751 B2     5/2013   Engl et al.
(Continued)

FOREIGN PATENT DOCUMENTS

| CN | 102157658 A | 8/2011 |
|----|-------------|--------|
| CN | 110858617 A | 3/2020 |
| JP | 2015015326 A | 1/2015 |

*Primary Examiner* — Evren Seven
*Assistant Examiner* — Cole Leon Lindsey
(74) *Attorney, Agent, or Firm* — CKC & Partners Co., LLC (57) ABSTRACT

The light emitting device includes a growth substrate, a light-emitting semiconductor structure, conductive pillars, an insulating layer, and first and second electrodes. The light-emitting semiconductor structure includes a first-type semiconductor layer, a light-emitting layer and a second-type semiconductor layer disposed on the growth substrate from top to bottom. The conductive pillars are disposed in the light-emitting semiconductor structure. The conductive pillars penetrates is in contact with the second-type semiconductor layer and electrically connected to the substrate. A first portion of the insulating layer is disposed between the first-type semiconductor layer and the substrate, and a second portion of the insulating layer electrically insulates the first-type semiconductor layer and the light emitting-layer from the conductive pillars. The first electrode is electrically connected to the first-type semiconductor layer and electrically insulated from the conductive pillars. The second electrode is electrically connected to the conductive pillar.

8 Claims, 6 Drawing Sheets

(51) Int. Cl.
  *H01L 33/22* (2010.01)
  *H01L 33/40* (2010.01)
  *H01L 33/42* (2010.01)
  *H01L 33/44* (2010.01)
  *H01L 33/62* (2010.01)

(52) U.S. Cl.
  CPC ............ *H01L 33/405* (2013.01); *H01L 33/42* (2013.01); *H01L 33/44* (2013.01); *H01L 33/62* (2013.01)

(56) References Cited

U.S. PATENT DOCUMENTS

| | | |
|---|---|---|
| 8,866,175 B2 | 10/2014 | Engl et al. |
| 2011/0193123 A1* | 8/2011 | Moon .................... H01L 33/382 |
| | | 257/E33.072 |
| 2011/0297969 A1* | 12/2011 | Kojima .................... H01L 33/50 |
| | | 257/E33.013 |
| 2012/0286307 A1 | 11/2012 | Fang et al. |
| 2014/0061700 A1* | 3/2014 | Lee ........................ H01L 33/382 |
| | | 438/27 |
| 2016/0118564 A1 | 4/2016 | Kim et al. |

\* cited by examiner

LIGHT EMITTING DEVICE

CROSS-REFERENCE TO RELATED APPLICATION

The present application is a Divisional Application of the U.S. application Ser. No. 17/246,693, filed May 2, 2021, which claims priority to China Application Serial Number 202010650792.2, filed Jul. 8, 2020, all of which are herein incorporated by reference in their entireties.

BACKGROUND

Field of Invention

The present disclosure relates to a light emitting device, in particular to a light emitting device capable of optimizing current diffusion.

Description of Related Art

A light emitting diode (LED) is essentially a diode with a P-N junction. The combination of electron-hole pairs when the element acts on causes emission of photons. In addition, the LED has advantages of energy saving, power saving, long life cycle and environmental protection, so it is one of booming industries in recent years. Generally, different LEDs can have different chip structures according to the light source systems and the purposes of use, such as face up LED, vertical LED, and flip chip LED. According to the light emitting surfaces, the LED can be roughly divided into side view LED and top view LED.

In order to improve luminous efficiency of the vertical LED and the flip-chip LED light emitting devices, a patterned current blocking layer is usually added between a semiconductor stack layer and a reflective layer, but the patterned current blocking layer have following disadvantages. Since current generated is mainly concentrated on an n-type conductive pillar and an opening area of the patterned current blocking layer, high current density will cause epitaxial recombination efficiency thereon to deteriorate, thereby causing the light emitting device to produce uneven brightness issues. Also, a thermal expansion coefficient of the patterned current blocking layer is very different from that of a semiconductor layer thereon and that of a reflective layer therebeneath, and thus it is easy to cause poor product yield during manufacturing processes, and during a reliability test, it leads to formation of a gap between the aforementioned film layers, resulting in product reliability issues.

SUMMARY

In view of this, a purpose of the present disclosure is to provide a light emitting device that can solve the aforementioned issues.

One aspect of the present disclosure is to provide a light emitting device, which includes a die-bonding substrate, a light emitting semiconductor structure, a plurality of conductive pillars, an insulating layer, a first electrode, and a second electrode. The die-bonding substrate has a first surface and a second surface opposite to each other, and the first surface includes a light emitting area and an electrode area. The light emitting semiconductor structure is disposed on the light emitting area. The light emitting semiconductor structure includes a first-type semiconductor layer, a light emitting layer and a second-type semiconductor layer from bottom to top. The conductive pillars are disposed in the light emitting semiconductor structure at intervals. Each conductive pillar is disposed through the first-type semiconductor layer and the light emitting layer and not disposed through the second-type semiconductor layer. Each conductive pillar is in direct contact with the second-type semiconductor layer and electrically connected to the die-bonding substrate. The insulating layer has a first portion and a second portion. The first portion is disposed between the first-type semiconductor layer and the die-bonding substrate. The second portion electrically insulates the first-type semiconductor layer and the light emitting layer from the conductive pillars. The first portion has a trench and a plurality of openings. The trench is adjacent to an edge of the light emitting semiconductor structure and a width of each opening is smaller than a width of each conductive pillar. The first electrode is disposed on the electrode area and electrically connected to the first-type semiconductor layer of the light emitting semiconductor structure, and the first electrode is electrically insulated from each conductive pillar. The second electrode is disposed on the second surface of the die-bonding substrate and electrically connected to the conductive pillars.

According to an embodiment of the present disclosure, a total length of the trench is greater than 60% of a circumference of the light emitting area.

According to an embodiment of the present disclosure, the trench continuously surrounds the edge of the light emitting area.

According to an embodiment of the present disclosure, the edge of the light emitting area and the nearest conductive pillar are separated by a distance, and a width of the trench is 10% to 30% of the distance.

According to an embodiment of the present disclosure, a number of the openings is greater than a number of the conductive pillars.

According to an embodiment of the present disclosure, a distance between two adjacent of the openings is greater than 1.5 times the first width.

According to an embodiment of the present disclosure, the light emitting device further includes a transparent conductive layer and a first electrode extension portion. The transparent conductive layer is disposed between the first-type semiconductor layer and the first portion. The transparent conductive layer includes indium tin oxide. The first electrode extension portion is disposed between the first portion and the die-bonding substrate. The first electrode extension portion is electrically connected to the transparent conductive layer through the trench and the openings.

According to an embodiment of the present disclosure, the light emitting device further includes a metal layer disposed between the first electrode extension portion and the transparent conductive layer, and the metal layer fills the trench and the openings. The metal layer includes silver or aluminum.

One aspect of the present disclosure is to provide a light emitting device, which includes a growth substrate, a light emitting semiconductor structure, a plurality of conductive pillars, an insulating layer, a first electrode, and a second electrode. The light emitting semiconductor structure is disposed on the growth substrate. The light emitting semiconductor structure includes a first-type semiconductor layer, a light emitting layer and a second-type semiconductor layer top to bottom. The conductive pillars are disposed in the light emitting semiconductor structure at intervals. Each conductive pillar is disposed through the first-type semiconductor layer and the light emitting layer and not disposed through the second-type semiconductor layer and in direct contact with the second-type semiconductor layer. The insulating layer has a first portion and a second portion. The first portion is disposed on the first-type semiconductor layer, and the second portion electrically insulates the first-type semiconductor layer and the light emitting layer from the conductive pillars. The first portion has a trench and a plurality of openings. The trench is adjacent to an edge of the growth substrate and a width of each opening is smaller than a width of each conductive pillar. The first electrode and the second electrode are disposed on the first-type semiconductor layer. The first electrode is electrically connected to the first-type semiconductor layer and electrically insulated from the conductive pillars, and the second electrode is electrically connected to the conductive pillar.

According to an embodiment of the present disclosure, a total length of the trench is greater than 60% of a circumference of the growth substrate.

According to an embodiment of the present disclosure, the trench continuously surrounds the edge of the growth substrate.

According to an embodiment of the present disclosure, the edge of the growth substrate and the nearest conductive pillar are separated by a distance, and a width of the trench is 10% to 30% of the distance.

According to an embodiment of the present disclosure, a number of the openings are greater than a number of the conductive pillars.

According to an embodiment of the present disclosure, a distance between two adjacent of the openings is greater than 1.5 times the first width.

According to an embodiment of the present disclosure, the light emitting device further includes a transparent conductive layer and a first electrode extension portion. The transparent conductive layer is disposed between the first-type semiconductor layer and the first portion. The transparent conductive layer includes indium tin oxide. The first electrode extension portion is disposed between the first portion and the first electrode. The first electrode extension portion is electrically connected to the transparent conductive layer through the trench and the openings.

According to an embodiment of the present disclosure, the light emitting device further includes a metal layer disposed between the first electrode extension portion and the transparent conductive layer, and the metal layer fills the trench and the openings. The metal layer includes silver or aluminum.

BRIEF DESCRIPTION OF THE DRAWINGS

In order to make the above and other objectives, features, advantages and embodiments of the present disclosure more obvious and understandable, the description of the accompanying drawings is as follows.

DETAILED DESCRIPTION

In order to make the description of the content of the present disclosure more detailed and complete, the following provides an illustrative description for implementation aspects and specific embodiments of the present disclosure; this is not the only way to implement or use the specific embodiments of the present disclosure. The embodiments disclosed below can be combined or substituted with each other under beneficial circumstances, and other embodiments can also be added to an embodiment without further description.

In the following description, many specific details will be described in detail so that the reader can fully understand the following embodiments. However, the embodiments of the present disclosure may be practiced without these specific details. In other cases, in order to simplify the drawings, well-known structures and devices are only schematically shown in the drawings.

Figure 1:
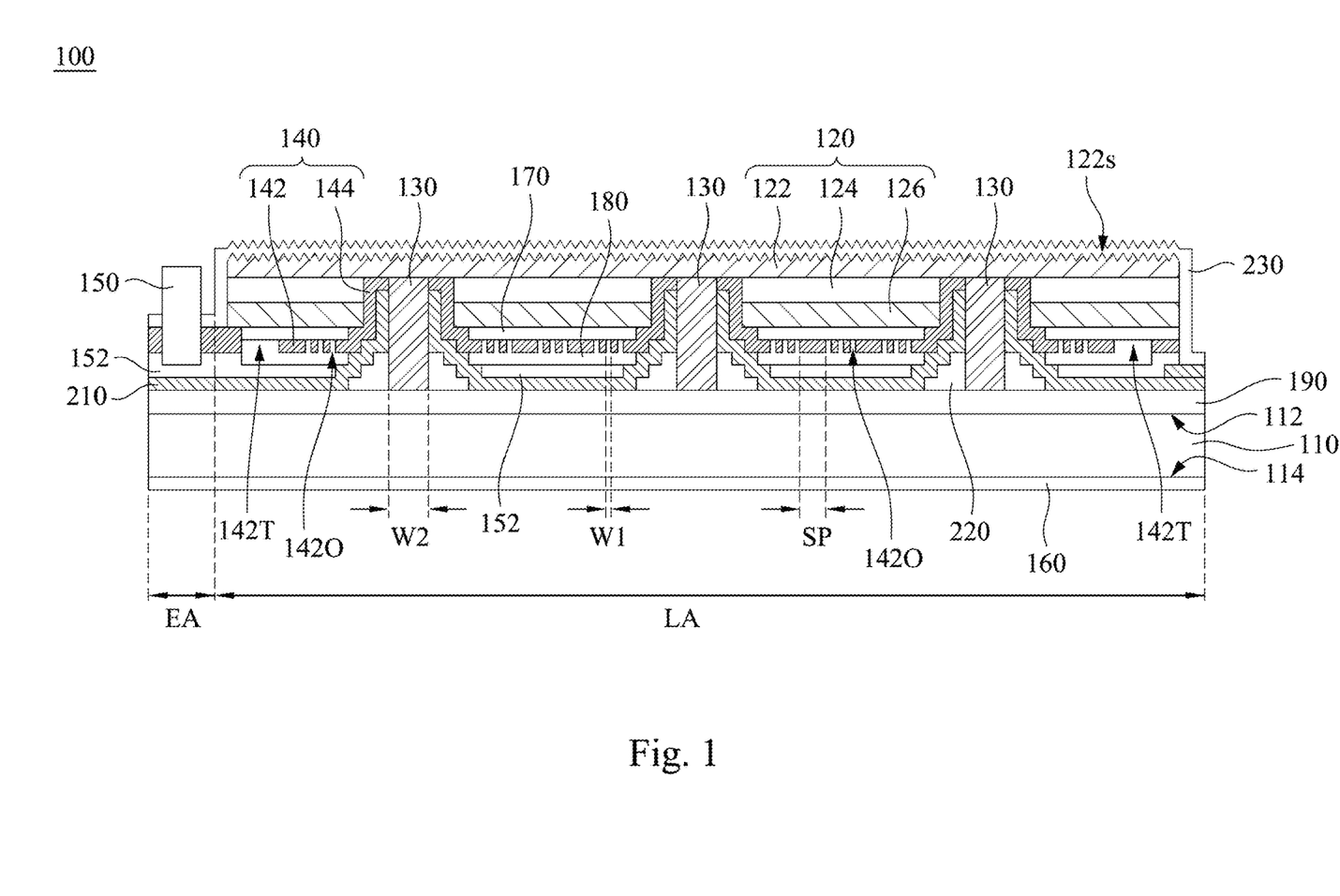
FIG. 1 is a schematic cross-sectional view of a light emitting device according to an embodiment of the present disclosure.
Figure 2A:
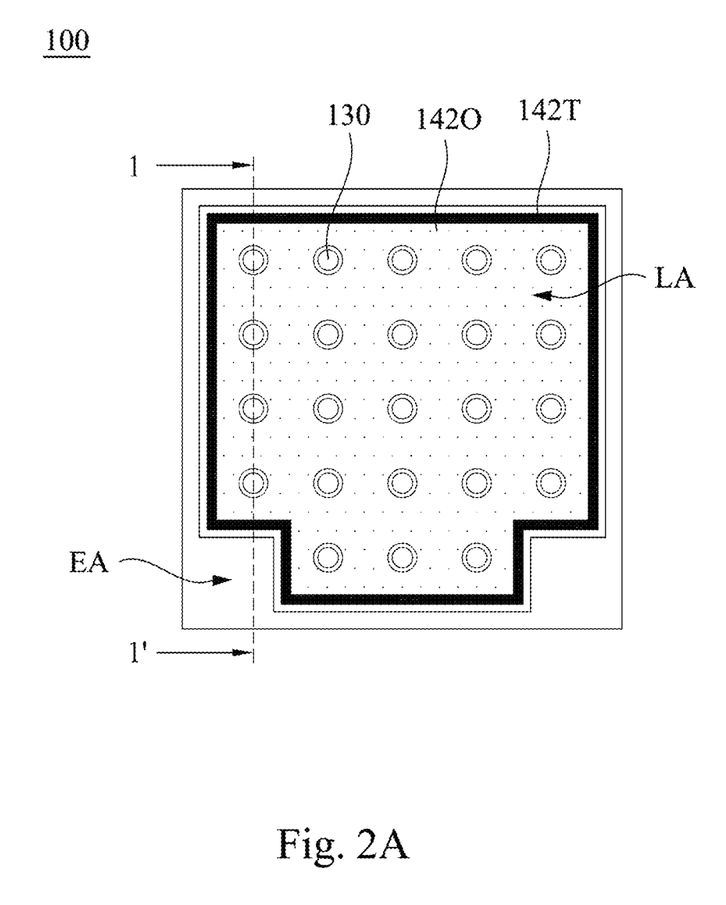
FIG. 2A is a schematic top view of a light emitting device according to an embodiment of the present disclosure.

One aspect of the present disclosure is to provide a light emitting device 100, particularly a light emitting device 100 with a vertical light emitting diode. FIG. 1 is a schematic cross-sectional view of a light emitting device 100 according to an embodiment of the present disclosure. FIG. 2A is a schematic top view of a light emitting device 100 according to an embodiment of the present disclosure. It is understandable that FIG. 1 may be a schematic cross-sectional view of FIG. 2A along a line 1-1'. Please refer to FIG. 1 and FIG. 2A. The light emitting device 100 includes a die-bonding substrate 110, a light emitting semiconductor structure 120, a plurality of conductive pillars 130, an insulating layer 140, a first electrode 150 and a second electrode 160.

The die-bonding substrate 110 has a first surface 112 and a second surface 114 opposed to each other, and the first surface 112 includes a light emitting area LA and an electrode area EA. In some embodiments, the die-bonding substrate 110 may be a rigid printed circuit board, a high thermal conductivity aluminum substrate, a flexible printed circuit board, a glass substrate, a metal composite material board, a ceramic substrate, a light emitting substrate, or a substrate with functional components such as transistors or integrated circuits (ICs).

The light emitting semiconductor structure 120 is disposed on the light emitting area LA. Specifically, the light emitting semiconductor structure 120 includes a first-type semiconductor layer 126, a light emitting layer 124, and a second-type semiconductor layer 122 from bottom to top. In some embodiments, the light emitting semiconductor structure 120 may be formed on a growth substrate (not shown) by epitaxial growth technology.

In some embodiments, the first-type semiconductor layer 126 may be a P type III-V semiconductor layer. For example, the III-V semiconductor layer may include a binary epitaxy material such as gallium arsenide (GaAs), gallium nitride (GaN), gallium phosphide (GaP), indium arsenide (InAs), aluminum nitride (AlN), indium nitride (InN) or indium phosphide (InP), or a ternary or quaternary epitaxial material such as gallium arsenide phosphide (GaAsP), aluminum gallium arsenide (AlGaAs), indium gallium phosphide (InGaP), indium gallium nitride (InGaN), aluminum gallium nitride (AlGaN), aluminum indium gallium phosphide (AlInGaP), indium gallium arsenide phosphide (InGaAsP), or aluminum indium gallium nitride (AlInGaN). Therefore, the P-type III-V semiconductor layer may be formed by doping the aforementioned III-V semiconductor layer with a group IIA element (e.g., beryllium, magnesium, calcium, or strontium).

In some embodiments, the light emitting layer 124 may include a multiple quantum well (MQW), a single-quantum well (SQW), a homojunction, a heterojunction or other similar structures.

In some embodiments, the second-type semiconductor layer 122 may be an N-type III-V semiconductor layer. For example, the III-V semiconductor layer may include a binary epitaxy material such as gallium arsenide (GaAs), gallium nitride (GaN), gallium phosphide (GaP), indium arsenide (InAs), aluminum nitride (AlN), indium nitride (InN) or indium phosphide (InP), or a ternary or quaternary epitaxial material such as gallium arsenide phosphide (GaAsP), aluminum gallium arsenide (AlGaAs), indium gallium phosphide (InGaP), indium gallium nitride (InGaN), aluminum gallium nitride (AlGaN), aluminum indium gallium phosphide (AlInGaP), indium gallium arsenide phosphide (InGaAsP), or aluminum indium gallium nitride (AlInGaN). Therefore, the N-type III-V semiconductor layer may be formed by doping the aforementioned III-V semiconductor layer with a group IVA element (e.g., silicon, etc.). It should be noted that a top surface 122s of the second-type semiconductor layer 122 is a light emitting surface of the light emitting device 100. In some embodiments, the top surface 122s of the second-type semiconductor layer 122 may have a rough texture. In many examples, the rough texture may include regular patterns or irregular patterns. Under this design, light extraction efficiency of the light emitting device 100 can be greatly increased. In some embodiments, the rough texture may be produced on the top surface 122s of the second-type semiconductor layer 122 by performing a suitable roughening process.

The conductive pillars 130 are disposed in the light emitting semiconductor structure 120 at intervals. Each conductive pillar 130 is disposed through the first-type semiconductor layer 126 and the light emitting layer 124 but not disposed through the second-type semiconductor layer 122. It should be noted that each conductive pillar 130 is in direct contact with the second-type semiconductor layer 122 and electrically connected to the die-bonding substrate 110. In some embodiments, a material of the conductive pillar 130 may include titanium (Ti), nickel (Ni), aluminum (Al), gold (Au), platinum (Pt), chromium (Cr), silver (Ag), copper (Cu) or their alloys.

The insulating layer 140 has a first portion 142 and a second portion 144. Specifically, the first portion 142 is disposed between the first-type semiconductor layer 126 and the die-bonding substrate 110, and the second portion 144 electrically insulates the first-type semiconductor layer 126 and the light emitting layer 124 from the conductive pillars 130. In more detail, the first portion 142 has a trench 142T and a plurality of openings 1420. It is worth noting that the trench 142T is adjacent to an edge of the light emitting semiconductor structure 120, and a first width W1 of each opening 1420 is smaller than a second width W2 of each conductive pillar 130. It should be noted that the insulating layer 140 serves as a current blocking layer in the light emitting device 100 to improve luminous efficiency of the light emitting device 100. In some embodiments, a material used for the insulating layer 140 may be silicon oxide, silicon nitride, silicon oxynitride, epoxy, or other suitable insulating materials.

It should be noted that the openings 1420 are used to disperse the current originally concentrated near the conductive pillar 130, and the trench 142T is used to guide the current to an edge of the light emitting area LA to optimize overall current density distribution of the light emitting device 100, thereby increasing the brightness of the light emitting device 100.

In some embodiments, a total length of the trench 142T is greater than 60% of a circumference of the light emitting area LA to achieve the effect of optimizing the current density distribution of the entire light emitting device 100. For example, the total length of the trench 142T may be greater than 65%, 70%, 75%, 80%, 85%, 90%, or 95% of the circumference of the light emitting area LA. In some embodiments, the trench 142T continuously surrounds the edge of the light emitting area LA. That is, the total length of the trench 142T is equal to the circumference of the light emitting area LA. In this embodiment, the current density distribution of the entire light emitting device 100 is relatively even.

In some embodiments, a number of the openings 1420 are greater than a number of the conductive pillars 130 to better disperse the current that is excessively concentrated near the conductive pillars 130. In some embodiments, a spacing SP between two adjacent of the openings 1420 is greater than 1.5 times the first width W1, so as to achieve the effect of improving the luminous efficiency of the light emitting device 100. In some embodiments, the edge of the light emitting area LA is separated from the nearest conductive pillar 130 by a distance, and a width of the trench 142T is 10% to 30% of the aforementioned distance. For example, the width of the trench 142T may be 15%, 20%, or 25% of the aforementioned distance. Specifically, when the width of the trench 142T is less than 10% of the aforementioned distance, the manufacturing process will be more difficult; when the width of the trench 142T is greater than 30% of the aforementioned distance, the current cannot be diffused to an outer edge of the light emitting device 100, resulting in lower brightness at the outer edge of the light emitting device 100.

The first electrode 150 is disposed in the electrode area EA and electrically connected to the first-type semiconductor layer 126, and the first electrode 150 is electrically insulated from each conductive pillar 130. In some embodiments, the first electrode 150 may include a transparent conductive material, a metal material, or a suitable conductive material. For example, the transparent conductive material includes indium tin oxide (ITO), indium zinc oxide (IZO), and aluminum zinc oxide (AZO); the metal material includes chromium (Cr), germanium gold (GeAu), gold (Au), titanium (Ti), aluminum (Al), nickel (Ni) and their alloys.

In some embodiments, the light emitting device 100 further includes a transparent conductive layer 170 and a first electrode extension portion 152. The transparent conductive layer 170 is disposed between the first-type semiconductor layer 126 and the first portion 142, and the first electrode extension portion 152 is disposed between the first portion 142 and the die-bonding substrate 110. It can be understood that the first electrode extension portion 152 is electrically connected to the transparent conductive layer 170 through the trench 142T and the openings 1420. In some embodiments, the transparent conductive layer 170 may include indium tin oxide (ITO), indium zinc oxide (IZO), aluminum zinc oxide (AZO), or a light-transmitting and conductive material. In one embodiment, the transparent conductive layer 170 includes indium tin oxide. In some embodiments, a material of the first electrode extension portion 152 may be the same or similar to that of the first electrode 152.

In some embodiments, the light emitting device 100 further includes a metal layer 180. The metal layer 180 is disposed between the first electrode extension portion 152 and the transparent conductive layer 170, and the metal layer 180 fills the trench 142T and the openings 142O. In some embodiments, the metal layer 180 includes silver (Ag) or aluminum (Al). It should be noted that the metal layer 180 can reflect light emitted by the light emitting layer 124 in the light emitting semiconductor structure 120 and then emit the light in a direction away from the die-bonding substrate 110 to increase light extraction efficiency. Therefore, the metal layer 180 can be acted as a reflective layer. It should be noted that since the metal layer 180 is in direct contact with the transparent conductive layer 170 at the trench 142T, it can increase adhesion of the outer edge of the light emitting device 100 and reduce the shrinkage difference in cold and heat between the metal layer 180 and the transparent conductive layer 170.

It can also greatly increase ability of the light emitting device 100 to withstand external stress, thereby improving the process yield, current withstand capability, and reliability.

The second electrode 160 is disposed on the second surface 114 and electrically connected to the conductive pillars 130. In many examples, the second electrode 160 completely covers the second surface 114 of the die-bonding substrate 110. This design makes it easy for large currents to pass through the light emitting device 100. In some embodiments, a material of the second electrode 160 may be the same or similar to that of the first electrode 150.

In some embodiments, the light emitting device 100 further includes a bonding metal layer 190. The bonding metal layer 190 is used to electrically connect the second electrode 160 and the conductive pillars 130. In some embodiments, the bonding metal layer 190 includes titanium (Ti), nickel (Ni), aluminum (Al), gold (Au), platinum (Pt), chromium (Cr), silver (Ag), copper (Cu), tin (Sn), or their alloys.

In some embodiments, the light emitting device 100 further includes an insulating layer 210. The insulating layer 210 is disposed between the first electrode extension portion 152 and the die-bonding substrate 110 and extends to be in contact with the second portion 144 of the insulating layer 140. In the embodiment including the bonding metal layer 190, the insulating layer 210 is disposed between the first electrode extension portion 152 and the metal layer 190. The insulating layer 210 is used to electrically insulate the first electrode 150 from the second electrode 160 and the conductive pillars 130. In some embodiments, the insulating layer 210 may include silicon oxide, silicon nitride, silicon oxynitride, epoxy, or other suitable insulating materials.

In some embodiments, the light emitting device 100 further includes a reflective layer 220. In the embodiment including the bonding metal layer 190 and the insulating layer 210, the reflective layer 220 is disposed on the bonding metal layer 190, and the reflective layer 220 is disposed between the conductive layer 130 and the insulating layer 210. In some embodiments, the reflective layer 220 may include silver (Ag) or aluminum (Al). The reflective layer 220 can reflect light emitted from a sidewall of the light emitting layer 124 again and then emit the light in a direction away from the die-bonding substrate 110 to increase the light extraction efficiency.

In some embodiments, the light emitting device 100 further includes an insulating layer 230. The insulating layer 230 conformally covers an upper surface of the second-type semiconductor layer 122 and exposes a portion of the first electrode 150. The exposed first electrode 150 can increase heat dissipation efficiency of the light emitting device 100. In the embodiment where the top surface 122s of the second-type semiconductor layer 122 has the rough texture, the insulating layer 230 is conformally formed on the second-type semiconductor layer 122, and thus has the same rough texture as that of the top surface 122s of the second-type semiconductor layer 122. It should be noted that the insulating layer 230 is at least disposed on a sidewall of the light emitting semiconductor structure 120, so as to prevent the first electrode 150 and the second-type semiconductor layer 122 from being short-circuited due to leakage current.

Figure 2B:
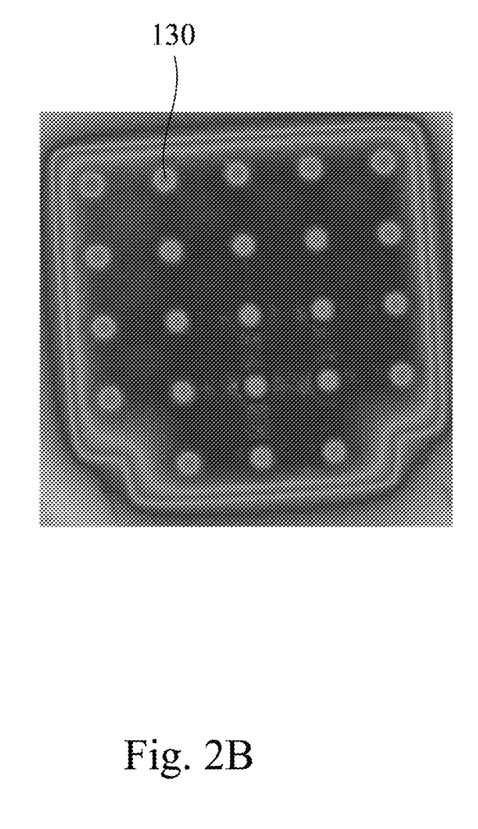
FIG. 2B is a current distribution diagram of the light emitting device of FIG. 2A.

FIG. 2B is a current distribution diagram of the light emitting device 100 of FIG. 2A. It can be seen from FIG. 2B that the light emitting device 100 of the present disclosure has excellent average current distribution.

Figure 3A:
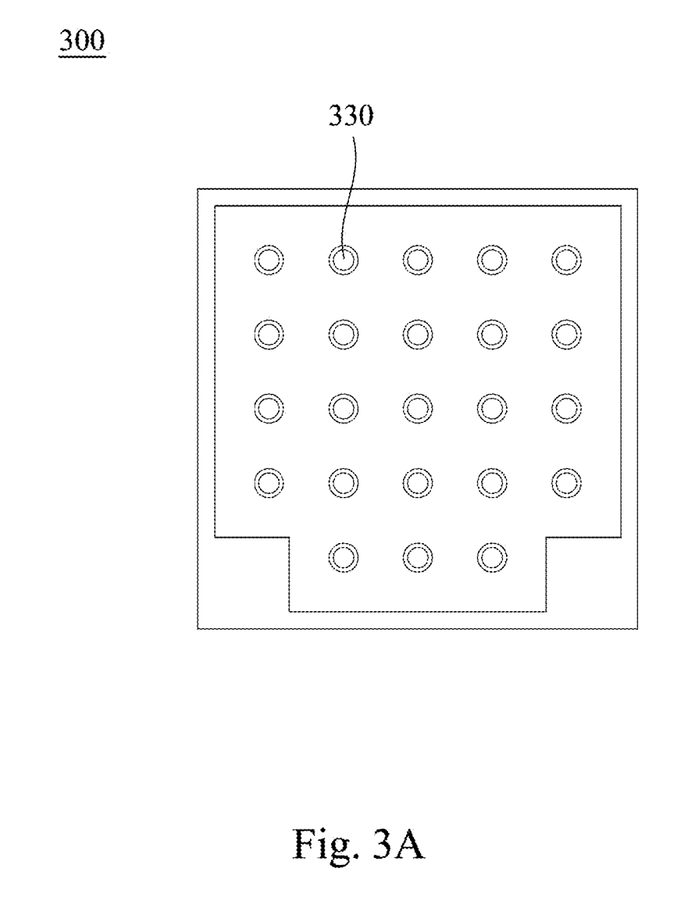
FIG. 3A is a schematic top view of a light emitting device of a comparative example of the present disclosure.
Figure 3B:
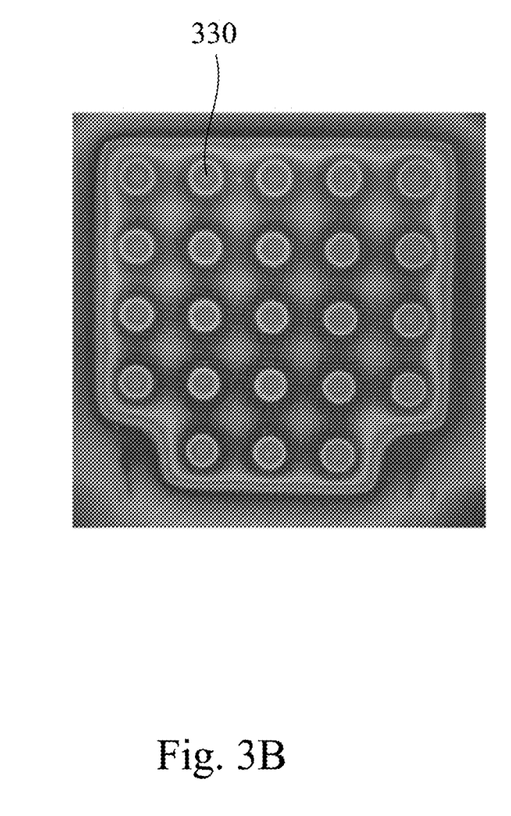
FIG. 3B is a current distribution diagram of the comparative example of FIG. 3A.

FIG. 3A is a schematic top view of a light emitting device 300 according to a comparative example of the present disclosure. FIG. 3B is a current distribution diagram of the comparative example of FIG. 3A. Specifically, the light emitting device 100 of the present disclosure has the insulating layer 140 disposed between the light emitting semiconductor structure 120 and the transparent conductive layer 170, and the openings 142O and the trench 142 (indicated in FIG. 1) disposed on the insulating layer 140. The light emitting device 300 of the comparative example of the present disclosure is similar to the light emitting device 100 of the present disclosure, but the light emitting device 300 does not have the aforementioned insulating layer disposed between the light emitting semiconductor structure and the transparent conductive layer. It can be seen from FIG. 3B that current of the light emitting device 300 is concentrated near the conductive pillars 330, resulting in poor epitaxial recombination efficiency of the light emitting semiconductor structure near the conductive pillars 330 at a high current density.

Figure 4A:
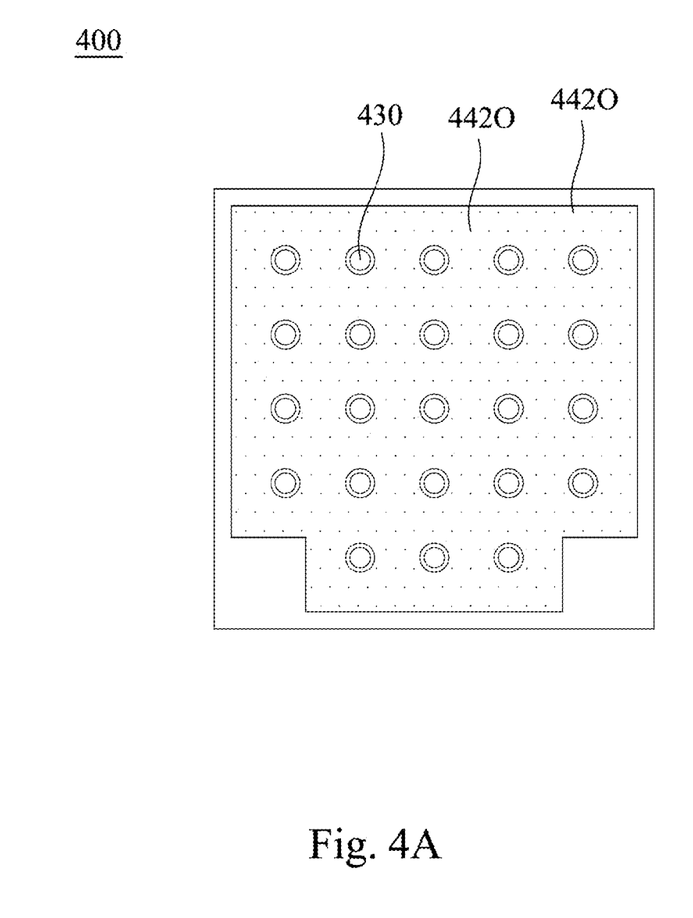
FIG. 4A is a schematic top view of a light emitting device according to another comparative example of the present disclosure.
Figure 4B:
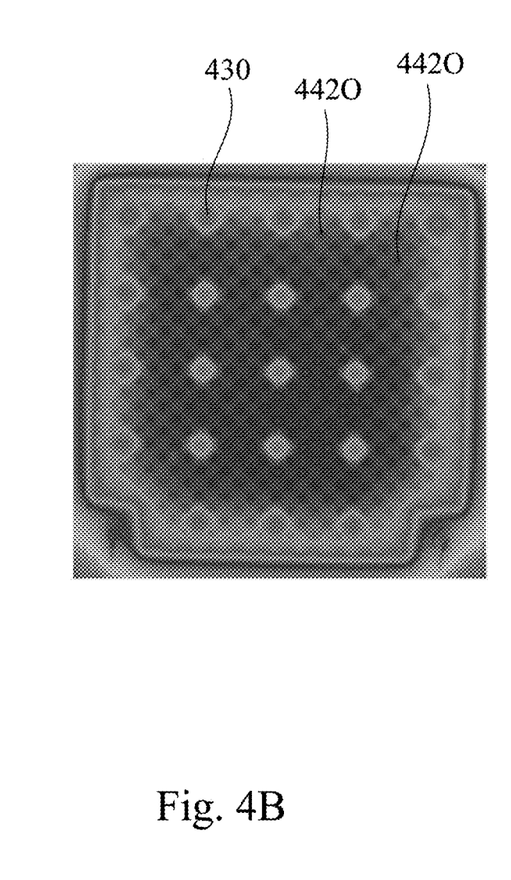
FIG. 4B is a current distribution diagram of the comparative example of FIG. 4A.

FIG. 4A is a schematic top view of a light emitting device 400 according to another comparative example of the present disclosure. FIG. 4B is a current distribution diagram of the comparative example of FIG. 4A. Specifically, the light emitting device 100 of the present disclosure has the insulating layer 140 disposed between the light emitting semiconductor structure 120 and the transparent conductive layer 170, and the openings 142O and the trench 142T (indicated in FIG. 1) disposed on the insulating layer 140. The light emitting device 400 of the comparative example of the present disclosure is similar to the light emitting device 100 of the present disclosure, but the light emitting device 400 only has openings 442O disposed on the insulating layer and does not have a trench disposed on the insulating layer. It can be seen from FIG. 4B that current of the light emitting device 400 is not completely concentrated near the conductive pillars 430 due to the design of the opening 442O, but an outer edge of the light emitting device 400 still belongs to a low current density area, so that brightness of the light emitting device 400 is uneven.

The following embodiments are used to describe specific aspects of the present disclosure, and enable those skilled in the art to which the present disclosure pertains to implement the present disclosure. However, the following embodiments should not be used to limit the present disclosure. Hereinafter, comparative examples and experimental examples are provided to verify the efficacy of the present disclosure.

Experimental Example: Reliability Test

Figure 5A:
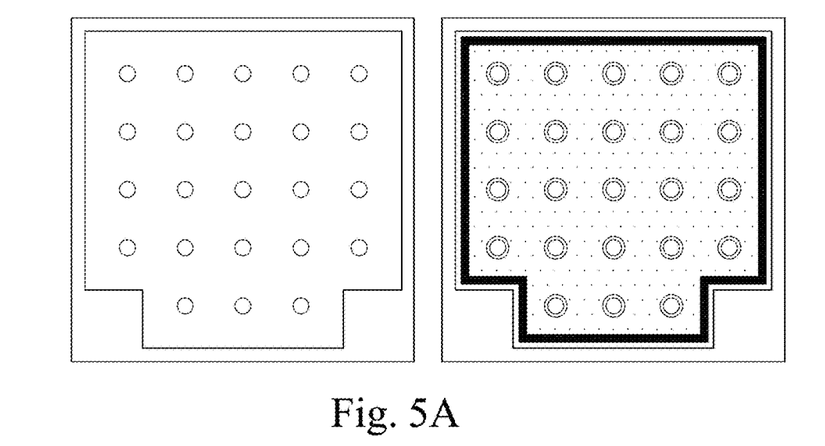
FIG. 5A is a design diagram of a light emitting device of an experimental example of the present disclosure.
Figure 5B:
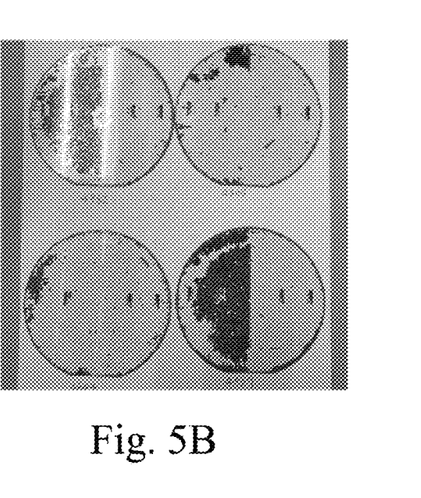
FIG. 5B, FIG. 5C and FIG. 5D are results of the experimental example of the present disclosure.
Figure 5C:
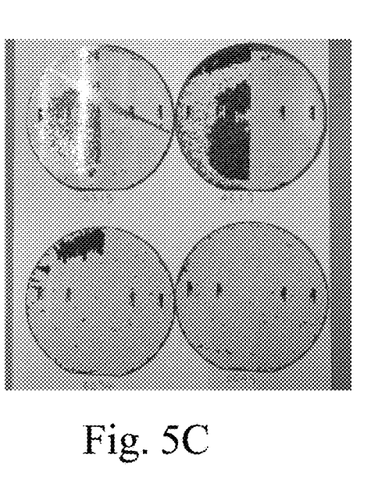
Figure 5D:
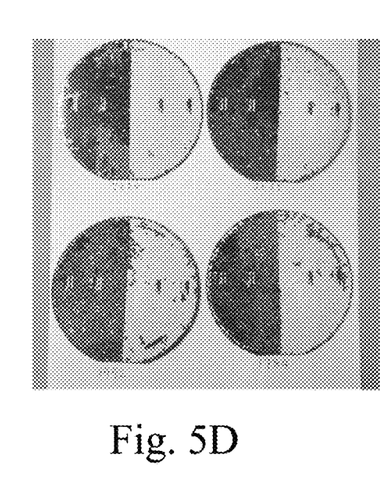

FIG. 5A is a design diagram of a light emitting device of an experimental example of the present disclosure. FIG. 5B, FIG. 5C and FIG. 5D are results of the experimental example of the present disclosure. In this experimental example, the design layout of the light emitting device 300 of the above comparative example and the design layout of the light emitting device 100 of the present disclosure were disposed on left and right sides of a wafer, respectively, as shown in FIG. 5A. The reliability test was conducted by applying different currents, and the results are shown in FIGS. 5B, 5C, and 5D. It can be seen from FIGS. 5B, 5C, and 5D that a peeling degree of the left half of the wafer was greater than that of the right half of the wafer. It can be seen that the design layout of the light emitting device 100 of the present disclosure can not only improve the reliability issue, but also increase the process yield by about 5% to 90%.

Figure 6:
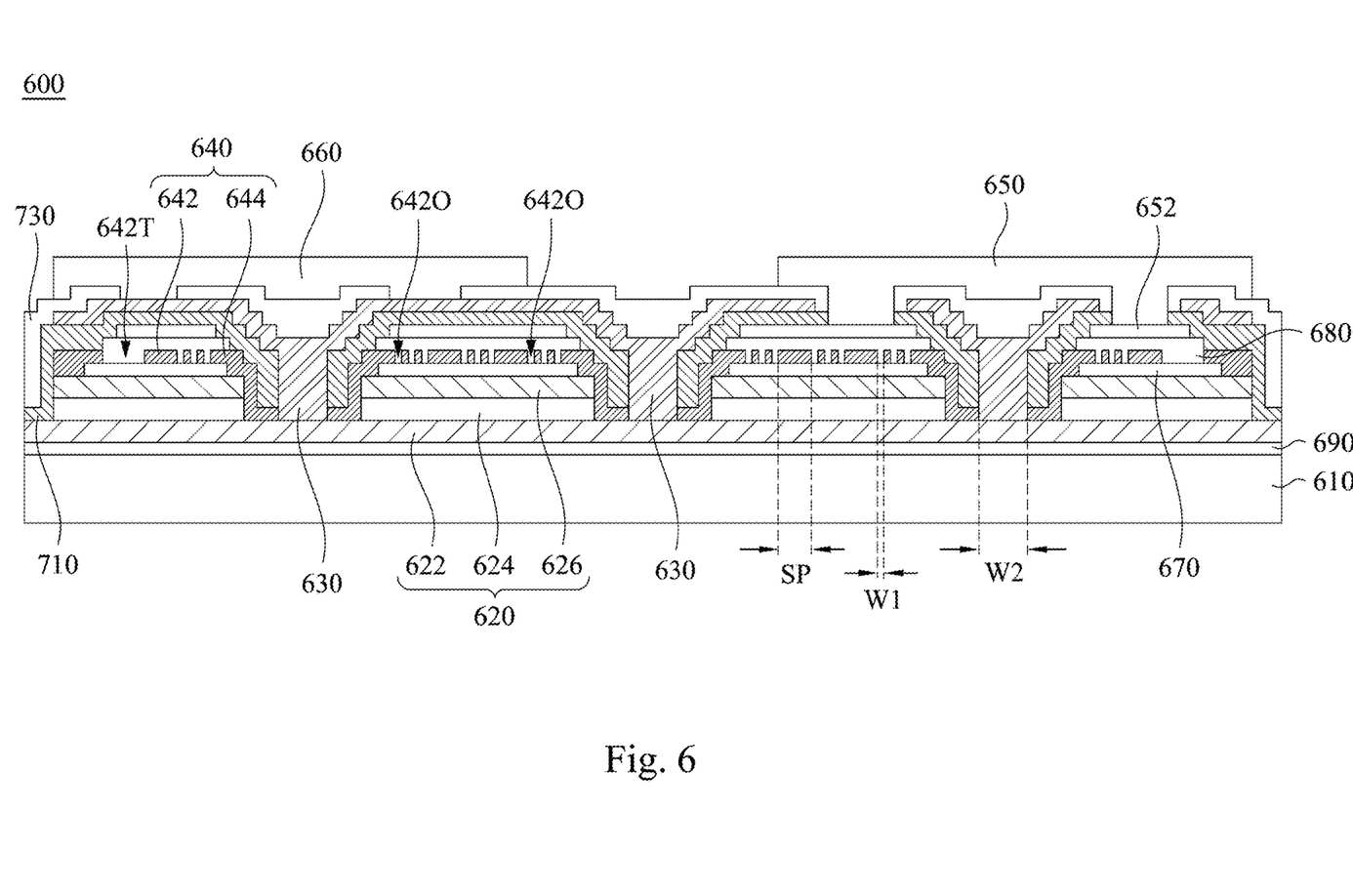
FIG. 6 is a schematic cross-sectional view of a light emitting device according to another embodiment of the present disclosure.

Another aspect of the present disclosure is to provide a light emitting device 600, particularly a flip chip type light emitting device 600. FIG. 6 is a schematic cross-sectional view of a light emitting device 600 according to another embodiment of the present disclosure. As shown in FIG. 6, the light emitting device 600 includes a growth substrate 610, a light emitting semiconductor structure 620, a plurality of conductive pillars 630, an insulating layer 640, a first electrode 650, and a second electrode 660. In an embodiment, the growth substrate 610 may be a sapphire substrate, a gallium oxide ($Ga_2O_3$) substrate, a silicon carbide (SiC) substrate or other suitable substrates.

The light emitting semiconductor structure 620 is disposed on the growth substrate 620. Specifically, the light emitting semiconductor structure 620 includes a first-type semiconductor layer 626, a light emitting layer 624, and a second-type semiconductor layer 622 from top to bottom. In some embodiments, the light emitting semiconductor structure 620 may be formed on the growth substrate 620 by epitaxial growth technology.

In some embodiments, the first-type semiconductor layer 626 may be a P-type III-V semiconductor layer, and the second-type semiconductor layer 622 may be an N-type III-V semiconductor layer. In an embodiment, a material of the first-type semiconductor layer 626 may be the same or similar to the material of the aforementioned first-type semiconductor layer 126. In an embodiment, a material of the light emitting layer 624 may be the same or similar to the material of the aforementioned light emitting layer 124. In an embodiment, a material of the second-type semiconductor layer 622 may be the same or similar to the material of the aforementioned second-type semiconductor layer 122.

The conductive pillars 630 are disposed in the light emitting semiconductor structure 620 at intervals. It should be noted that each conductive pillar 630 is disposed through the first-type semiconductor layer 626 and the light emitting layer 624 and not disposed through the second-type semiconductor layer 622 and in direct contact with the second-type semiconductor layer 622. In some embodiments, a material of the conductive pillar 630 may be the same or similar to the material of the aforementioned conductive pillar 130.

The insulating layer 640 has a first portion 642 and a second portion 644. The first portion 642 is disposed on the first-type semiconductor layer 626, and the second portion 644 electrically insulates the first-type semiconductor layer 626 and the light emitting layer 624 from the conductive pillars 630. In more detail, the first portion 642 has a trench 642T and a plurality of openings 6420. The trench 642T is adjacent to an edge of the growth substrate 610, and a first width W1 of each opening 6420 is smaller than a second width W2 of each conductive pillar 630. It should be noted that the insulating layer 640 serves as a current blocking layer in the light emitting device 600 to improve luminous efficiency of the light emitting device 600. In some embodiments, a material of the insulating layer 640 may be the same or similar to the material of the aforementioned insulating layer 140.

It should be noted that the trench 642T is used to guide the current to an edge of the growth substrate 610 to optimize overall current density distribution of the light emitting device 600, thereby increasing the brightness of the light emitting device 600.

It should be noted that the openings 6420 are used to disperse the current originally concentrated near the conductive pillar 630, and the trench 642T is used to guide the current to the edge of the growth substrate 610 to optimize overall current density distribution of the light emitting device 600, thereby increasing the brightness of the light emitting device 600.

In some embodiments, a total length of the trench 642T is greater than 60% of a circumference of the growth substrate 610 to achieve the effect of optimizing the current density distribution of the entire light emitting device 600. For example, the total length of the trench 642T may be greater than 65%, 70%, 75%, 80%, 85%, 90%, or 95% of the circumference of the growth substrate 610. In some embodiments, the trench 642T continuously surrounds the edge of the growth substrate 610. That is, the total length of the trench 642T is equal to the circumference of the growth substrate 610. In this embodiment, the current density distribution of the entire light emitting device 600 is relatively even. In some embodiments, the edge of the growth substrate 610 is separated from the nearest conductive pillar 630 by a distance, and a width of the trench 642T is 10% to 30% of the distance. For example, the width of the trench 642T may be 15%, 20%, or 25% of the aforementioned distance. Specifically, when the width of the trench 642T is less than 10% of the aforementioned distance, the manufacturing process will be more difficult; when the width of the trench 642T is greater than 30% of the aforementioned distance, the current cannot be diffused to an outer edge of the light emitting device 600, resulting in lower brightness at the outer edge of the light emitting device 600. In some embodiments, a number of the openings 6420 are greater than a number of conductive pillars 630 to better disperse the current that is excessively concentrated near the conductive pillars 130. In some embodiments, a spacing SP between two adjacent of the openings 6420 is greater than 1.5 times the first width W1.

The first electrode 650 and the second electrode 660 are disposed on the first-type semiconductor layer 626. Specifically, the first electrode 650 is electrically connected to the first-type semiconductor layer 626 and is electrically insulated from the conductive pillars 630, and the second electrode 660 is electrically connected to the conductive pillars 630. In some embodiments, the first electrode 650 and the second electrode 660 may be made of the same or similar material(s) as the aforementioned first electrode 150 and the second electrode 160.

In some embodiments, the light emitting device 600 further includes a transparent conductive layer 670, a first electrode extension portion 652, and a metal layer 680. Specifically, the transparent conductive layer 670 is disposed between the first-type semiconductor layer 626 and the first portion 642, and the first electrode extension portion 652 is disposed between the first portion 642 and the first electrode 650. The metal layer 680 is disposed between the transparent conductive layer 670 and the first electrode extension portion 652. It should be noted that the metal layer 680 fills the openings 6420 and the trench 642T and is in contact with the transparent conductive layer 670. It can be understood that the first electrode extension portion 652 is electrically connected to the transparent conductive layer 670 through the trench 642T and the openings 6420. Materials, functions and other features of the transparent conductive layer 670, the first electrode extension portion 652, and the metal layer 680 may be the same or similar to those of the transparent conductive layer 170, the first electrode extension portion 152, and the metal layer 180.

In some embodiments, the light emitting device 600 further includes a third-type semiconductor layer 690. Specifically, the third-type semiconductor layer 690 is sandwiched between the second-type semiconductor layer 622 and the growth substrate 610. In some embodiments, the third type semiconductor layer 690 may be an undoped III-V semiconductor layer. For example, the III-V semiconductor layer may include a binary epitaxy material such as gallium arsenide (GaAs), gallium nitride (GaN), gallium phosphide (GaP), indium arsenide (InAs), aluminum nitride (AlN), indium nitride (InN) or indium phosphide (InP), or a ternary or quaternary epitaxial material such as gallium arsenide phosphide (GaAsP), aluminum gallium arsenide (AlGaAs), indium gallium phosphide (InGaP), indium gallium nitride (InGaN), aluminum gallium nitride (AlGaN), aluminum indium gallium phosphide (AlInGaP), indium gallium arsenide phosphide (InGaAsP), or aluminum indium gallium nitride (AlInGaN).

In some embodiments, the light emitting device 600 further includes an insulating layer 710 and an insulating layer 730. The insulating layer 710 conformally covers the light emitting semiconductor structure 620, the insulating layer 640, the metal layer 680, and the first electrode extension portion 652. The insulating layer 710 is used to electrically insulate the first electrode 150 from the conductive pillars 630. In the embodiment including the insulating layer 710, a top of the conductive pillar 630 extends covering a portion of the insulating layer 710. The insulating layer 730 conformally covers the insulating layer 710 and the conductive pillars 630. It should be noted that the insulating layer 710 and the insulating layer 730 have openings such that the first electrode 650 is in direct contact with the first electrode extension portion 652. In some embodiments, the insulating layer 710 may include silicon oxide, silicon nitride, silicon oxynitride, epoxy, or other suitable insulating materials.

In summary, the insulating layer provided between the light emitting semiconductor structure and the metal layer of the present disclosure can improve the luminous efficiency of the light emitting device, and the openings provided in the insulating layer can disperse the current to avoid the current concentration near the conductive pillars. Furthermore, in the present disclosure, the trench is provided on the insulating layer adjacent to the edge of the light emitting area to guide the current to the edge of the light emitting device, so that the current is more evenly distributed in the light emitting device. In addition, since the metal layer is in direct contact with the transparent conductive layer at the trench, the adhesion of the outer edge of the light emitting device (at the trench) is increased. It can also increase the ability of the light emitting device 100 to withstand the external stress, thereby improving the process yield, current withstand capability, and reliability.

Although the present disclosure has been disclosed in the above embodiments, it is not intended to limit the present disclosure. Anyone who is familiar with this technique can make various changes and modifications without departing from the spirit and scope of the present disclosure. Therefore, the protection scope of the present disclosure shall be subject to the scope defined by the appended claims.

What is claimed is:

1. A light emitting device, comprises:
a growth substrate;
a light emitting semiconductor structure disposed on the growth substrate, the light emitting semiconductor structure including a first-type semiconductor layer, a light emitting layer and a second-type semiconductor layer from top to bottom;
a plurality of conductive pillars disposed in the light emitting semiconductor structure at intervals, and each of the conductive pillars disposed through the first-type semiconductor layer and the light emitting layer and not disposed through the second-type semiconductor layer and in direct contact with the second-type semiconductor layer;
an insulating layer having a first portion and a second portion, the first portion disposed on the first-type semiconductor layer, and the second portion electrically insulating the first-type semiconductor layer and the light emitting layer from the conductive pillars, wherein the first portion has a trench and a plurality of openings, and the trench is adjacent to an edge of the growth substrate, and a first width of each of the openings is smaller than a second width of each of the conductive pillars;
a first electrode and a second electrode disposed on the first-type semiconductor layer, wherein the first electrode is electrically connected to the first-type semiconductor layer and electrically insulated from the conductive pillars, and the second electrode is electrically connected to the conductive pillars;
a transparent conductive layer disposed between the first-type semiconductor layer and the first portion and electrically connected to the first semiconductor layer, wherein a portion of the transparent conductive layer is exposed from the trench and the openings; and
a first electrode extension portion disposed between the first portion and the first electrode, wherein the first electrode extension portion is electrically connected to the transparent conductive layer through the trench and the openings.

2. The light emitting device of claim 1, wherein a total length of the trench is greater than 60% of a circumference of the growth substrate.

3. The light emitting device of claim 1, wherein the trench continuously surrounds the edge of the growth substrate.

4. The light emitting device of claim 1, wherein the edge of the growth substrate and the nearest conductive pillar are separated by a distance, and a width of the trench is 10% to 30% of the distance.

5. The light emitting device of claim 1, wherein a first number of the openings is greater than a second number of the conductive pillars.

6. The light emitting device of claim 1, wherein a distance between two adjacent of the openings is greater than 1.5 times the first width.

7. The light emitting device of claim 1,
wherein the transparent conductive layer includes indium tin oxide.

8. The light emitting device of claim 7, further comprising a metal layer disposed between the first electrode extension portion and the transparent conductive layer, and the metal layer fills the trench and the openings, wherein the metal layer includes silver or aluminum.

\* \* \* \* \*